(12) United States Patent
Iguchi et al.

(10) Patent No.: US 8,921,829 B2
(45) Date of Patent: Dec. 30, 2014

(54) LIGHT RECEIVING ELEMENT, LIGHT RECEIVING ELEMENT ARRAY, HYBRID-TYPE DETECTING DEVICE, OPTICAL SENSOR DEVICE, AND METHOD FOR PRODUCING LIGHT RECEIVING ELEMENT ARRAY

(75) Inventors: Yasuhiro Iguchi, Osaka (JP); Hiroshi Inada, Osaka (JP); Youichi Nagai, Osaka (JP); Hideaki Nakahata, Itami (JP); Katsushi Akita, Itami (JP); Takashi Ishizuka, Itami (JP); Kei Fujii, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 7 days.

(21) Appl. No.: 13/520,007

(22) PCT Filed: Mar. 10, 2011

(86) PCT No.: PCT/JP2011/055588
§ 371 (c)(1),
(2), (4) Date: Jun. 29, 2012

(87) PCT Pub. No.: WO2011/118399
PCT Pub. Date: Sep. 29, 2011

(65) Prior Publication Data
US 2012/0298957 A1 Nov. 29, 2012

(30) Foreign Application Priority Data
Mar. 25, 2010 (JP) .................................. 2010-070993

(51) Int. Cl.
*H01L 29/06* (2006.01)
*H01L 27/146* (2006.01)

(52) U.S. Cl.
CPC ...... *H01L 27/1464* (2013.01); *H01L 27/14694* (2013.01); *H01L 27/14652* (2013.01)
USPC .......................................................... 257/21

(58) Field of Classification Search
CPC ............ H01L 31/035236; H01L 27/14; H01L 27/146; H01L 27/14634; H01L 27/1464; H01L 27/14652

USPC ............................................. 257/E31.033, 21
See application file for complete search history.

(56) References Cited

U.S. PATENT DOCUMENTS

2005/0199976 A1 9/2005 Iguchi
2010/0051905 A1* 3/2010 Iguchi et al. ..................... 257/14

FOREIGN PATENT DOCUMENTS

EP 0 216 572 4/1987
EP 0 473 198 A1 3/1992
(Continued)

OTHER PUBLICATIONS

Machine translation of Japanese Patent Application Publication # 2001-007378.*

(Continued)

*Primary Examiner* — Anthony Ho
(74) *Attorney, Agent, or Firm* — Venable LLP; Michael A. Sartori; Tamatane J. Aga

(57) ABSTRACT

The present invention provides a light receiving element array etc., having a high light-reception sensitivity in the near-infrared region, an optical sensor device, and a method for producing the light receiving element array. A light receiving element array 55 includes an n-type buffer layer 2 disposed on an InP substrate 1, an absorption layer 3 having a type-II MQW, a contact layer 5 disposed on the absorption layer, and a p-type region extending to the n-type buffer layer 2 through the absorption layer 3, wherein the p-type region formed by selective diffusion is separated from the p-type region of an adjacent light receiving element by a region that is not subjected to selective diffusion, and, in the n-type buffer layer, a p-n junction 15 is formed on a crossed face of a p-type carrier concentration of the p-type region and an n-type carrier concentration of the buffer layer.

12 Claims, 11 Drawing Sheets

(56) References Cited

FOREIGN PATENT DOCUMENTS

| JP | 04-312986 | 11/1992 |
|---|---|---|
| JP | 2001-007378 | 1/2001 |
| JP | 2006-165113 | 6/2006 |
| JP | 2007-081331 | 3/2007 |
| JP | 2008-047587 | 2/2008 |
| JP | 2009-206499 | 9/2009 |
| JP | 2010-050417 | 3/2010 |
| JP | 2010-054457 | 3/2010 |

OTHER PUBLICATIONS

Nobile et al., Midinfrared intersubband absorption in InGaAs/GaAsSb multiple quantum wells, Jul. 27 2009, Applied Physics Letters, 95, 041102.*

Takahashi et al., "The Noble InGaAs Photodiodes for Near Infrared Detection," Optronics, No. 3, pp. 107-113 (1997).

Sidhu et al., "A 2.3 µm Cutoff Wavelength Photodiode on InP Using Lattice-Matched GaInAs-GaAsSb Type-II Quantum Wells," 2005 International Conference on Indium Phosphide and Related Materials, pp. 148-151 (2005).

Klem et al., "Growth and Properties of GaAsSb/InGaAs Superlattices on InP," Journal of Crystal Growth, 111, pp. 628-632 (1991).

Higashino et al., "Properties of $In_{0.53}Ga_{0.47}As/GaAs_{0.5}Sb_{0.5}$ Type II Multiple Quantum Well Structures Grown on (1 1 1)B InP Substrates by Molecular Beam Epitaxy," Journal of Crystal Growth, 243, pp. 8-12 (2002).

Supplementary European Search Report in European Patent Application No. 11759206.3, dated Jun. 20, 2014.

* cited by examiner

NUMBER OF ELEMENTS : 320 × 256
PITCH : 30 μm PITCH
SIZE : 10 mm IN WIDTH × 9 mm IN LENGTH

A

B

A

B

LIGHT RECEIVING ELEMENT, LIGHT RECEIVING ELEMENT ARRAY, HYBRID-TYPE DETECTING DEVICE, OPTICAL SENSOR DEVICE, AND METHOD FOR PRODUCING LIGHT RECEIVING ELEMENT ARRAY

TECHNICAL FIELD

The present invention relates to a light receiving element, a light receiving element array, a hybrid-type detecting device, an optical sensor device, and a method for producing a light receiving element array, all of which target light in the near-infrared region.

BACKGROUND ART

The near-infrared region corresponds to an absorption spectrum range related to biological objects such as plants and animals, and the environment. Therefore, the development of a detector of near-infrared light, the detector including an absorption layer composed of a group III-V compound semiconductor, has been actively conducted. A known example of a detector that converts photo-induced charge into an output signal includes a light receiving element array in which the sensitivity is extended to a wavelength of 2.6 µm by using extended-InGaAs as an absorption layer and a complementary metal-oxide semiconductor (CMOS) functioning as a read-out IC (ROIC) and connected to the light receiving element array (NPL 1). In the light receiving element array, electrons of electron-hole pairs generated by incident light are collected in a common n-side electrode, and holes of the electron-hole pairs are read out from a p-side electrode, which is a pixel electrode, to the CMOS.

In addition, it has been reported that a pin-type photodiode including an absorption layer having a type-II multi-quantum well structure (MQW) composed of InGaAs/GaAsSb and a p-type pixel region has a sensitivity up to a wavelength of 2.5 µm (NPL 2). Furthermore, in order to obtain a satisfactory crystal quality of a type-II InGaAs/GaAsSb MQW that absorbs near-infrared light having a wavelength of up to 3 µm, a laminated structure of a photodiode and a method for producing the photodiode have been proposed (PTL 1).

It has also been reported that when the above type-II MQW composed of InGaAs/GaAsSb is grown without doping, the MQW has the n-conductivity type (NPL 3 and NPL 4). In such a case, the photodiode may be referred to as an n-type photodiode rather than a pin-type photodiode. In general, a photodiode obtained in this case is also included in the category of pin-type photodiodes. The above pin-type photodiode can be obtained by easily forming a p-type region in each light receiving element using Zn, which is a p-type impurity and for which abundant data has been accumulated.

CITATION LIST

Patent Literature

PTL 1: Japanese Unexamined Patent Application Publication No. 2009-206499

Non Patent Literature

NPL 1: Hideo Takahashi, et al., "InGaAs photodetector for near infrared", OPTRONICS (1997), No. 3, pp. 107-113
NPL 2: R. Sidhu, N. Duan, J. C. Campbell, and A. L. Holmes, Jr., "A 2.3 µm cutoff wavelength photodiode on InP using lattice-matched GaInAs—GaAsSb type-II quantum wells" 2005 International Conference on Indium Phosphide and Related Materials
NPL 3: J. F. Klem, S. R. Kurtz, "Growth and properties of GaAsSb/InGaAs superlattices on InP", Journal of Crystal Growth, Vol. 111, 628 (1991)
NPL 4: T. Higashino, Y. Kawamura, M. Fujimoto, M. Amano, T. Yokoyama, and N. Inoue, "Properties of $In_{0.53}Ga_{0.47}As/GaAs_{0.5}Sb_{0.5}$ type-II multiple quantum well structures grown on (111)B InP substrates by molecular beam epitaxy", Journal of Crystal Growth, Vol. 243, 8 (2002)

DISCLOSURE OF INVENTION

Technical Problem

However, the InGaAs photodetector (image sensor) for near infrared described in NPL 1 includes an absorption layer composed of InGaAs having a composition which is not lattice-matched with an InP substrate. Therefore, the dark current of the photodetector is large, thereby increasing noise. Although, for example, distortion in the photodetector is gradually absorbed by providing a buffer layer, the effect of absorption is limited. In order to reduce the noise and to improve the S/N ratio to a level for practical use, a cooling device is necessary, and thus the size of the photodetector is increased. In addition, InP or the like cannot be used as a window layer that is epitaxially grown on an InGaAs absorption layer. For example, when InAsP (where a ratio As/P is about 0.6/0.4) that lattice-matches with the InGaAs absorption layer is used as the window layer, the sensitivity to a wavelength range of 1 to 1.5 µm is decreased in both cases of front illumination and rear illumination because InAsP has an absorption band in this wavelength range. Regarding the light receiving elements disclosed in PTL 1 and NPL 2 to NPL 4, no example of a detecting device including an array of the light receiving elements has been reported, and no example of a measurement of the sensitivity etc. of a detecting device including such an array has also been reported.

An object of the present invention is to provide a light receiving element, a light receiving element array, a hybrid-type detecting device, and an optical sensor device, all of which have a high light-reception sensitivity in the near-infrared region, and a method for producing the light receiving element array.

Solution to Problem

In a light receiving element array of the present invention, a plurality of light receiving elements are arranged on a substrate composed of a compound semiconductor. This light receiving element array includes an n-type buffer layer disposed on the substrate, an absorption layer disposed on the n-type buffer layer and having a type-II multi-quantum well structure, a contact layer disposed on the absorption layer, and a p-type region that is provided for each of the light receiving elements, and that extends from a surface of the contact layer to the n-type buffer layer through the absorption layer. The p-type region is formed by selectively diffusing a p-type impurity in a depth direction, the p-type region of a light receiving element is separated from the p-type region of an adjacent light receiving element by a region that is not subjected to selective diffusion, and, in the n-type buffer layer, a p-n junction is formed on a crossed face of a p-type carrier concentration of the p-type region and an n-type carrier concentration of the n-type buffer layer.

In an MQW, a plurality of pairs of two types of compound semiconductor layers are stacked. In the type-II MQW, the energy levels of the valence band and the conduction band of a compound semiconductor layer (layer a) are higher than those of another compound semiconductor layer (layer b). However, since the Fermi levels of these two layers coincide with each other, the conduction band of the layer b has an energy level higher than the energy level of the valence band of the layer a. In the type-II MQW, when light is received, an electron located in the valence band of the layer a absorbs incident light and is excited to the conduction band of the layer b. As a result, a hole is generated in the valence band of the layer a, and the excited electron is located in the conduction band of the layer b. An electron of the valence band of the layer a is excited to the conduction band of the layer b in this manner, whereby incident light having a lower energy (longer wavelength) can be received.

In the light receiving element array of the present invention, light reception information is obtained by collecting the hole in a p-side electrode provided on a surface of a contact layer while an electron is collected in an n-side electrode. Therefore, the hole generated in the MQW must be moved to the surface of the contact layer. However, since a large number of well barriers are present in the valence band of the MQW, in the related art, many holes disappear in a halfway position before the holes reach the p-side electrode. Accordingly, for example, when light is incident from a rear surface of a substrate and holes are generated by light reception in the MQW at a position near the substrate, a considerably high proportion of the holes do not reach the p-side electrode, resulting in a decrease in the light-reception sensitivity. In order to move the valence band in the MQW from the layer a to the layer b, it is necessary to increase a difference $\Delta Ev$ between the energy of the top of the valence band of the layer a and the energy of the top of the valence band of the layer b. Holes cannot move from the layer a to the layer b without overcoming this energy barrier $\Delta Ev$.

It should be noted that a band model is prepared for an electron, and thus, regarding a hole, the relationship of respective bands is inverted in the vertical direction. Accordingly, for a hole, the top of the valence band of the layer a becomes the bottom of a quantum well.

In a light receiving element or the like in the related art, the light receiving element or the like is formed as a pin-type photodiode. Specifically, the light receiving element or the like has a laminated structure of contact layer in p-type region/i-type (or n⁻-type) absorption layer/n-type buffer layer (or n-type substrate). In the case of an i-type absorption layer, holes are not present in the absorption layer. In the case of an n⁻-type absorption layer, electrons derived from an impurity may be present in the conduction band of the absorption layer, but holes are not present. Accordingly, a quantum well for a hole in the layer a, the quantum well being formed by the valence band of the layer a and the valence band of the layer b, becomes a net quantum well barrier for the hole as it is. As a result, even when a driving force due to a reverse bias electric field is applied, it is difficult for the hole to move in the MQW.

According to the above structure of the present invention, a p-type region constituting a pixel of the light receiving element array reaches a buffer layer through an absorption layer. That is, the MQW is converted into a p-type MQW. Therefore, in the valence band of the layer a of the MQW, at least a low energy level is occupied by holes derived from a p-type impurity. Holes occupy levels in the order of energy from the lowest level. Thus, holes occupy levels in ascending order from the ground level of holes in the valence band of the layer a (from the top level of the valence band for electrons). When the p-type impurity is controlled to be an appropriate range, holes occupy low energy levels of the valence band of the layer a in a limited manner. Consequently, for a hole generated by light reception, the bottom of the valence band of the layer a is raised by being filled with a hole derived from the p-type impurity. Specifically, for a hole generated by light reception, a hole derived from the p-type impurity functions as a step, and thus the difference $\Delta Ev$ in energy between the valence band of the layer a and the valence band of the layer b becomes small (is substantially decreased). Consequently, holes generated in the layer a by light reception can relatively easily move to the valence band of the adjacent layer b. Even when the holes pass a large number of quantum wells from a light-receiving position to the p-side electrode, the holes do not disappear. As a result, a high light-reception sensitivity can be ensured.

Furthermore, since an independent light receiving element can be formed without mesa etching or the like, the dark current can be reduced. In addition, since a high sensitivity can be ensured in the near-infrared region where absorption bands of a biological component and the like are located, the detection accuracy of the biological component and the like can be increased.

In the case where the state of a hole is discussed using a band for an electron, literal interpretation may cause confusion in some points. However, in any case, interpretation should be performed in accordance with the gist of the present invention apparent from the context.

The absorption layer and the contact layer may be n-type except for the p-type region, and the p-type region may be surrounded by an n-type region. With this structure, pixels can be reliably separated from each other, thereby preventing, for example, interference between the pixels. In addition, the distance between pixels for separating the pixels can be reduced, as compared with the case where the p-type region is surrounded by an i-type region, and this is advantageous in the reduction in size.

The p-type carrier concentration of the p-type region in the absorption layer having the multi-quantum well structure may be 5e15 cm⁻³ or more and 1e17 cm⁻³ or less. When the p-type carrier concentration is less than 5e15 cm⁻³, the arrangement of holes in the valence band of the layer a in the MQW is insufficient. When the p-type carrier concentration is more than 1e17 cm⁻³, the crystal quality of the MQW is impaired. By controlling the p-type carrier concentration in the absorption layer having the multi-quantum well structure in the above range, degradation of the crystal quality of the MQW can be prevented while the bottom of the valence band of the layer a in the MQW is raised by arranging a hole derived from a p-type impurity in the valence band.

The n-type carrier concentration of the n-type buffer layer may be 1e15 cm⁻³ or more and 5e15 cm⁻³ or less. In this case, a pin-type photodiode can be formed while a p-n junction is provided in the buffer layer and the purity of the buffer layer is maintained. When the carrier concentration exceeds 5e15 cm⁻³, a pin-type photodiode cannot be formed in terms of purity. When the n-type carrier concentration is less than 1e15 cm⁻³, it is difficult to stably arrange a p-n junction in the buffer layer, resulting in an increase in the risk of the formation of a p-n junction in an InP substrate through the buffer layer.

Note that the buffer layer can be considered to be an i-type portion in terms of a portion of the photodiode. In the description below, the buffer layer will be described as an i-type portion of the photodiode. In the description below, the buffer layer will be described as an i-type portion of the photodiode because the carrier concentration of the buffer layer is low.

The n-type buffer layer may have a thickness of 1 µm or more and 6 µm or less. When the thickness of the buffer layer is less than 1 µm, it is difficult to form a p-n junction so that the p-n junction is stably disposed in the buffer layer, and the risk of the formation of the p-n junction in an InP substrate increases. When the thickness of the buffer layer exceeds 6 µm, the buffer layer has an excessively large thickness. Consequently, when the bias voltage is set to a usual level, a depletion layer does not spread in the MQW, resulting in a decrease in the light-reception sensitivity.

Light may be incident from a rear surface of the substrate. For example, an antireflection film (AR film) is arranged on the rear surface of the substrate, and substrate-rear-surface illumination may be performed. With this structure, a hybrid-type detecting device or the like can be easily assembled.

Light may be incident from the contact layer side, which is a side opposite to the substrate, and the absorption layer having the multi-quantum well structure may have a thickness of 2 µm or more. With this structure, even in the case of contact layer illumination, many of holes generated by light reception can be made to contribute to signal formation by the above-described bottom-raising effect due to a hole derived from the p-type impurity while a high light-reception sensitivity can be obtained by the large thickness of the absorption layer.

The substrate composed of a compound semiconductor may be an InP substrate, and the type-II MQW constituting the absorption layer may be a repetition of any one of (GaAsSb/InGaAs), (GaAsSb/InGaAsN), (GaAsSb/InGaAsNSb), and (GaAsSb/InGaAsNP). With this structure, it is possible to obtain a light receiving element array for near-infrared having a sensitivity at a long wavelength in the near-infrared region. In particular, by using InGaAsN in which nitrogen is added to InGaAs or by using a distortion-compensated MQW, the range of the light-reception sensitivity can be extended to a wavelength of about 3 µm.

In the above case, the layer a described above is a GaAsSb layer and the layer b described above is an InGaAs layer. In the case where a large number of quantum wells are interposed between a light-receiving position and the p-side electrode, many of holes generated by light reception disappear in a halfway position in the MQW without the bottom-raising effect due to a hole derived from the p-type impurity.

The light receiving element array may further include a selective diffusion mask pattern disposed so as to cover the contact layer and having an opening on the p-type region. In the case where a p-type impurity is selectively diffused using the selective diffusion mask pattern disposed on the contact layer, the p-type impurity diffuses from an opening in the thickness direction, and also slightly diffuses in the lateral direction. Specifically, in plan view, a p-type region is formed in a range wider than the opening on the surface of the contact layer. Therefore, after the p-type region is formed by selective diffusion, on the surface of the contact layer, the boundary between the p-type region and a region that is not subjected to the selective diffusion is covered with a mask portion as long as the width of the mask portion is within the above range. When the selective diffusion mask pattern is once removed to remove the covering of the mask portion, a surface level is formed at the boundary, resulting in an increase in the dark current. Once such a surface level is formed, a light receiving element array having no surface level cannot be formed unless a feat, such as covering a portion of the surface level while removing the portion, is performed. In reality, there is no method for producing a light receiving element array having no surface level except that the selective diffusion mask pattern is left without further treatment.

The selective diffusion mask pattern on the contact layer is composed of SiN or the like, but a simple passivation film may also be composed of SiN. Whether a SiN film is used as the selective diffusion mask pattern or not can be determined by examining (1) a dimension of the p-type region extending from the edge of an opening on the surface of the contact or (2) the presence or absence of a p-type impurity such as Zn in a film that is incontact with the cap layer.

A hybrid-type detecting device of the present invention includes any of the light receiving element arrays described above and a read-out circuit formed in silicon. In this hybrid-type detecting device, a read-out electrode of the read-out circuit is conductively connected to a corresponding p-side electrode of the light receiving element array. Accordingly, a detecting device having a high accuracy can be economically obtained.

In the hybrid-type detecting device, light may be incident from a rear surface of the substrate of the light receiving element array. In the case of a one-dimensional light receiving element array, wiring connected to an electrode of a read-out circuit or the like can be provided without interference even in the case of contact layer illumination. However, in the case of a two-dimensional array, substrate illumination is inevitable. In the case of substrate illumination, light incident from the rear surface of a substrate is immediately received at a position near the substrate in the absorption layer. A hole generated by the light reception must pass a large number of quantum wells before the hole reach the p-side electrode in order to contribute to signal formation. According to the above light receiving element array, even in this mounting configuration, a hole generated by light reception passes through the MQW and reaches the p-side electrode, thus contributing to signal formation.

An optical sensor device of the present invention includes any of the light receiving elements, any of the light receiving element arrays, or any of the hybrid-type detecting devices. Accordingly, in combination with an optical element such as a diffraction grating, an optical sensor device having a high sensitivity in the near-infrared region can be obtained.

The optical sensor device is obtained in combination with an optical element such as an optical system, e.g., a spectrometer or a lens. For example, a wavelength distribution can be measured with the optical sensor device, or the optical sensor device can be used as an imaging device. Thus, various practically useful products can be obtained. Naturally, the optical sensor device is often combined with a control device such as a microcomputer. Specific examples of the optical sensor device include (i) an imaging device for supporting visibility or monitoring, (ii) examination devices such as a biological component examination device, a moisture examination device, and a food quality examination device, and (iii) a monitoring device for examining a component of combustion gas. In short, the optical sensor device may be any device obtained by combining the light receiving element, the light receiving element array, or the hybrid-type detecting device described above with an optical element such as a lens, a filter, an optical fiber, a diffraction grating, or a spectral lens. In the case where screen display or determination is performed, a microcomputer or a screen display device is further added.

A light receiving element of the present invention is formed on a substrate composed of a compound semiconductor. This light receiving element includes a substrate, an n-type buffer layer disposed on the substrate, an absorption layer disposed on the n-type buffer layer and having a type-II multi-quantum well structure, a contact layer disposed on the absorption layer, and a p-type region extending from a surface of the contact layer to the n-type buffer layer through the absorption layer. The p-type region is formed by selectively diffusing a p-type impurity from the surface of the contact layer in a depth direction, the p-type region is separated from the periphery by a region that is not subjected to selective diffusion, and, in the n-type buffer layer, a p-n junction is formed on a crossed face of a p-type carrier concentration of the p-type region and an n-type carrier concentration of the n-type buffer layer.

According to this structure, a photodiode having a high sensitivity in a long-wavelength region of the near-infrared region can be obtained on the basis of the above-described mechanism in the light receiving element array.

According to a method for producing a light receiving element array of the present invention, a light receiving element array in which light receiving elements are arranged on a substrate composed of a compound semiconductor is produced. This production method includes the steps of growing a buffer layer on a substrate composed of a compound semiconductor; growing, on the buffer layer, an absorption layer having a type-II MQW; growing a contact layer on the absorption layer; forming, on the contact layer, a selective diffusion mask pattern having an opening in order to form a p-type region by selectively diffusing a p-type impurity for each of the light receiving elements; and selectively diffusing the p-type impurity from the opening of the selective diffusion mask pattern to form the p-type region extending from a surface of the contact layer to the buffer layer through the absorption layer.

According to the above method, the light-reception sensitivity can be ensured even in the case of substrate illumination, and a light receiving element array with a low dark current can be easily produced.

The substrate may be an InP substrate, and the type-II multi-quantum well structure may be a repetition of any one of (GaAsSb/InGaAs), (GaAsSb/InGaAsN), (GaAsSb/InGaAsNSb), and (GaAsSb/InGaAsNP). In the step of selectively diffusing the p-type impurity, the light receiving element array in the course of production having the selective diffusion mask pattern, zinc in the solid state, and red phosphorus may be sealed in a container and heated to a range of 500° C. to 650° C. In this case, Zn, which is a p-type impurity, can be easily introduced by selective diffusion to form a p-type region for each light receiving element. The reason why red phosphorus is added is to prevent dephosphorization. In order to conduct selective diffusion at a high temperature range, red phosphorus, which has a dephosphorization action higher than that of zinc phosphide, is used alone. A zinc wire is used for the purpose of selective diffusion of zinc.

Advantageous Effects of Invention

The light receiving element array etc. of the present invention include a type-II MQW as an absorption layer and target a long-wavelength region of the near-infrared region. In the light receiving element array etc. of the present invention, electrons of electron-hole pairs generated by light reception are collected in an n-side electrode, and holes of the electron-hole pairs, the holes having a small mobility, are efficiently caused to reach a p-side electrode by converting the MQW into a p-type MQW over the entire thickness of the MQW. Accordingly, the light receiving element array etc. of the present invention can have a satisfactory light-reception sensitivity in both cases of substrate illumination and contact layer illumination.

REFERENCE SIGNS LIST

1 InP substrate, 2 buffer layer, 3 absorption layer, 4 diffusion concentration distribution control layer, 5 contact layer, 6 p-type region, 6s red phosphorus, 6w zinc wire, 10 hybrid-type detecting device, 11 p-side electrode (pixel electrode), 12 n-side electrode (ground electrode), 12*b* connection electrode, 15 p-n junction, 20 optical sensor device, 29 quartz tube, 31, 31*b* bonding bump, 35 antireflection film, 36 selective diffusion mask pattern, 37, 37*e* passivation film, 50 light receiving element, 55 light receiving element array, 50*a* InP wafer, 60 control device, 61 display device, 63 light source, 64 irradiation optical fiber, 65 information-carrying optical fiber, 67 actuator, 69 filter, 70 CMOS (read-out circuit), 71 pad (read-out electrode), 72 ground electrode, 68 concave mirror, 85 control unit, 85*b* microcomputer, 85*c* display unit, 91 diffraction grating (spectrometer), P pixel.

BEST MODES FOR CARRYING OUT THE
INVENTION

<Problem in Hybrid-Type Detecting Device Prior to the Present Invention>

A problem, which will be described here, regarding a hybrid-type detecting device in the latest technology prior to the present invention, the device including an absorption layer constituted by a type-II MQW for the near-infrared region, has not yet been known.

Figure 18:
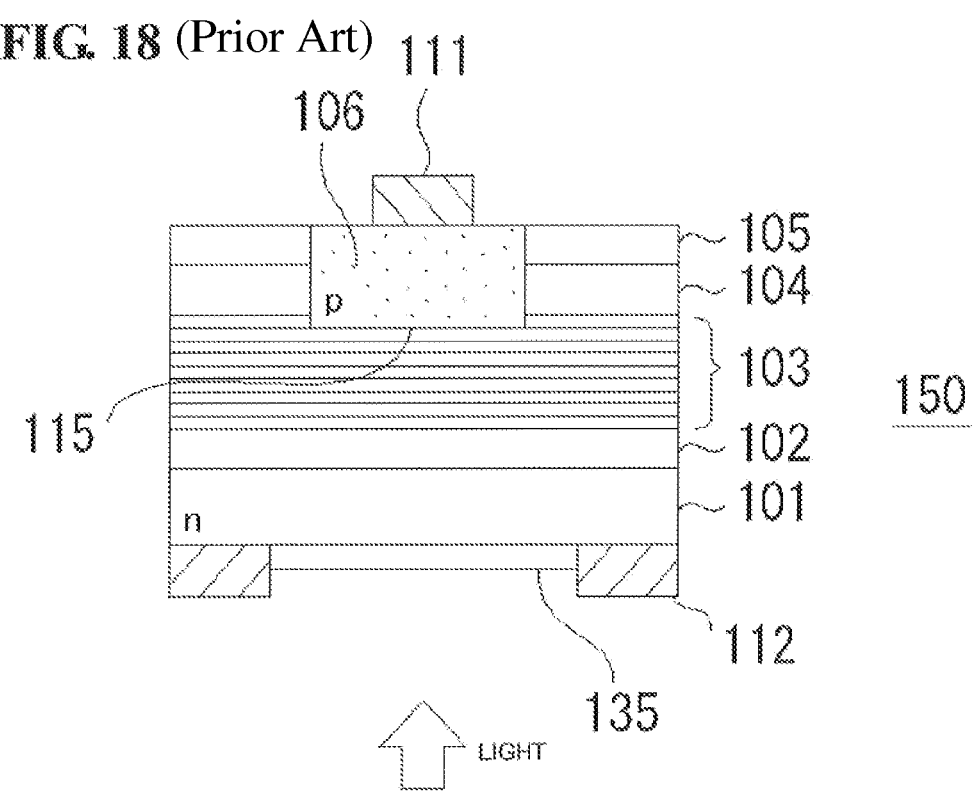
FIG. 18 is a view illustrating a light receiving element prior to the present invention.

FIG. 18 is a view illustrating a light receiving element 150 in the latest technology prior to the present invention. The light receiving element 150 has the following laminated structure:

n-type InP substrate 101/n-type InP (or InGaAs) buffer layer 102/absorption layer 103 having type-II MQW composed of (InGaAs/GaAsSb)/InGaAs diffusion concentration distribution control layer 104/InP contact layer 105

Light is incident from the InP substrate 101 side. This incidence is hereinafter referred to as "substrate illumination". On the other hand, incidence from the contact layer 105 side is referred to as "contact layer illumination". The light receiving element 150 or a photodiode includes a p-n junction 115 located at a leading end of a p-type region 106 that is introduced from the surface of the InP contact layer 105 by selective diffusion. The p-n junction 115 is separated from an end face by a region that is not subjected to the selective diffusion. An antireflection film 135 which is an SiON film is arranged on the rear surface of the InP substrate 101, the rear surface functioning as an incident surface on which light is incident.

A p-side electrode or a pixel electrode 111 of the light receiving element is arranged so as to form an ohmic contact with the p-type region 106. A ground electrode 112 is arranged so as to form an ohmic contact with the n-type InP substrate 101.

In light reception, a reverse bias voltage is applied to the p-n junction 115. Specifically, a voltage is applied between the pixel electrode 111 and the ground electrode 112 so that the electric potential of the ground electrode 112 is higher than that of the pixel electrode 111. A depletion layer spreads to the absorption layer 103 having the type-II MQW, and electron-hole pairs are generated by light that reaches the absorption layer 103. Since the electric potential of the pixel electrode 111 is lower than that of the ground, the pixel electrode 111 collects holes and charges of the holes form pixel information. By reading out the charges of a pixel at predetermined time intervals, an image, the intensity distribution of a measurement signal, or the like can be formed.

Figure 19:
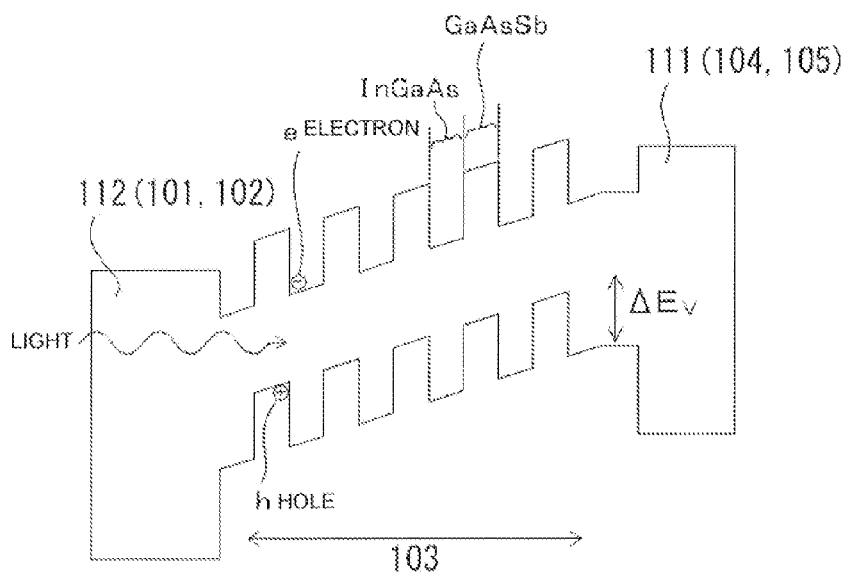
FIG. 19 includes energy bands of a light receiving element prior to the present invention, the light receiving element including an absorption layer constituted by a type-II MQW. Part A illustrates a case of substrate illumination, and part B illustrates a case of contact layer illumination.
Figure 19:
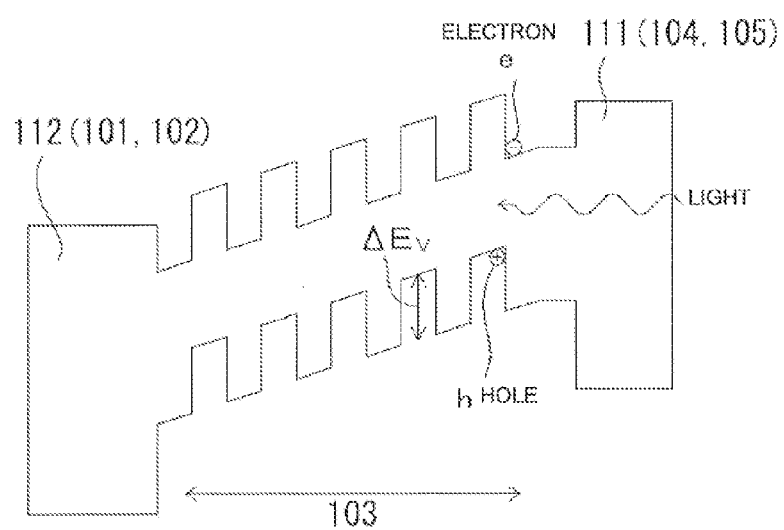

As illustrated in parts A and B of FIG. 19, in the type-II MQW constituting the absorption layer 103, a hole h is generated in the valence band of GaAsSb by light reception. An electron e is excited to the conduction band of InGaAs. Hereafter, attention is paid to the hole h. The band diagrams illustrated in FIG. 19 are each a band diagram for an electron. Therefore, regarding a hole h, the relationship is inverted in the vertical direction. Part A of FIG. 19 illustrates a case of substrate illumination as illustrated in FIG. 18. Part B of FIG. 19 illustrates a case of contact layer illumination, in which light is incident from the opposite side of the substrate. In the case of substrate illumination, light is immediately received in the depletion layer at a position near the substrate to generate a hole h. As illustrated in part A of FIG. 19, the hole h must pass the absorption layer 103 of the MQW while overcoming a large number of high well barriers ΔEv and reach the contact layer 105, though the hole h is driven by the reverse bias electric field.

Comparing part A and part B of FIG. 19, in the case of substrate illumination, the hole h generated by light reception cannot reach the pixel electrode 111 without overcoming a large number of barriers ΔEv of the MQW. In contrast, in the case of contact layer illumination, light reception occurs in the MQW at a position near the pixel electrode 111, and a hole h need not overcome a large number of MQW in order to reach the pixel electrode 111.

In the case of substrate illumination, holes h generated by light reception partially receive energy of light. However, while the holes h overcome a large number of quantum wells, unless the ground state is occupied, a high proportion of the holes h transit to the ground state and are trapped in the ground state. The holes h trapped in the ground state must overcome the high well barriers ΔEv in the valence band in order to drift to the contact layer 105 side. Therefore, the number of holes reaching the p-type region 106 or the pixel electrode 111 is significantly decreased from the number of holes generated by light reception. As a result, the light-reception sensitivity decreases. It is known that the effective mass of a hole is originally larger than that of an electron, and the mobility of the hole is small. However, the above decrease in the light-reception sensitivity cannot be explained by such a general magnitude of the mobility. The mechanism of the phenomenon of the above decrease in the light-reception sensitivity is under investigation. In any case, regarding a light receiving element array 150 or hybrid-type detecting device 110 which includes an absorption layer 103 having a type-II MQW and in which a pixel electrode 111 is arranged on a p-type region 106 and a hole is used as signal charge, the following experimental facts were confirmed.

As for a light receiving element including an absorption layer having a type-II MQW, in the case of contact layer illumination, the quantum efficiency of near-infrared light is 0.3 to 0.9. This quantum efficiency is satisfactory.

However, as for the same light receiving element array, in the case of substrate illumination, the quantum efficiency of the near-infrared region is decreased to a very low value, i.e., 0.05 to 0.5. In the case where a two-dimensional light receiving element array is used, wiring is formed for each pixel. Accordingly, in order to avoid interruption of light, the interruption being due to the presence of the wiring, substrate illumination, in which light is incident from the rear surface of an InP substrate, is inevitable.

<Points of the Present Invention>

Features of the present invention lie in the following points. A light receiving element or a light receiving element array includes an absorption layer having a type-II MQW ((InGaAs/GaAsSb)). A point of the present invention lies in that, in this light receiving element or the light receiving element array, a p-type region is formed so as to extend from a contact layer to a buffer layer through the absorption layer, and a p-n junction is formed in the buffer layer. A pixel electrode is arranged on the resulting p-type contact layer on the absorption layer so as to form an ohmic contact. In the present invention, the p-type region is formed in (the contact layer/the absorption layer having a type-II MQW/a part of the buffer layer) while a hole is used as signal charge, whereby the light-reception sensitivity or the quantum efficiency can be increased in both the cases of substrate illumination and contact layer illumination. The mechanism of this advantage will be described in detail below.

(Embodiment 1)

Figure 1:
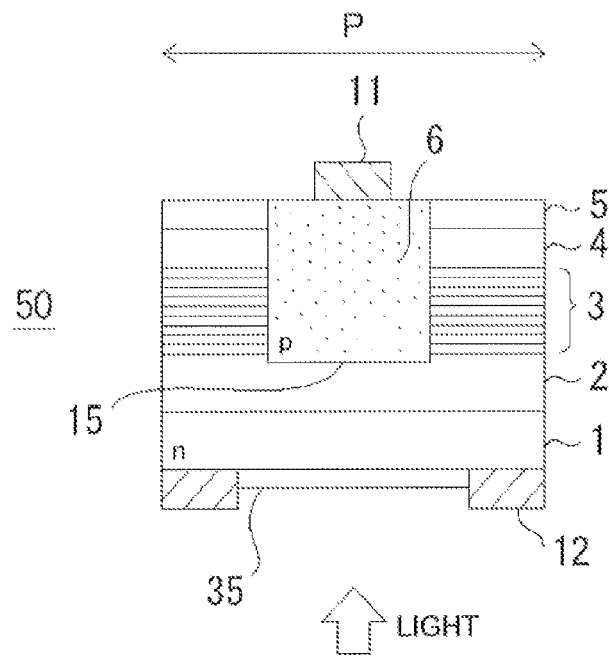
FIG. 1 is a cross-sectional view of a light receiving element according to Embodiment 1 of the present invention.

FIG. 1 is a view illustrating a light receiving element 50 according to Embodiment 1 of the present invention. The light receiving element 50 or photodiode is formed of a laminate of n-type InP substrate 1/n-type InP buffer layer 2/type-II MQW absorption layer 3/diffusion concentration distribution control layer 4/InP contact layer 5. The type-II MQW absorption layer 3 is formed by stacking InGaAs (layer b described above)/GaAsSb (layer a described above). A p-type region 6 is formed by selectively diffusing zinc (Zn), which is a p-type impurity, and a p-n junction 15 is formed at a leading end of the p-type region 6. The p-type region 6 that forms a main portion of the light receiving element constituting a pixel P is separated from an end face by a region that is not subjected to the selective diffusion. Thus, the light receiving element 50 having a simple structure and having a low dark current can be obtained without mesa etching.

In the case where the absorption layer 3 is formed of a laminate of InGaAs/GaAsSb as described above, the diffusion concentration distribution control layer 4 may be interposed between the InP contact layer 5 and the MQW absorption layer 3 in order to suppress the Zn concentration to a predetermined level or less when zinc (Zn), which is a p-type impurity, is diffused. The diffusion concentration distribution control layer 4 is illustrated in FIG. 1. However, this diffusion concentration distribution control layer 4 may not be formed. An antireflection film 35 which is an SiON film is arranged on the rear surface of the InP substrate 1, the rear surface functioning as an incident surface on which light is incident.

A feature of the light receiving element 50 of this embodiment lies in that the p-type region 6 extends from the surface of the InP contact layer 5 to the buffer layer 2 through the type-II MQW absorption layer 3. The p-type region 6 converts all the quantum wells of the MQW absorption layer 3 into p-type quantum wells and reaches the buffer layer 2, and the p-n junction 15 is located in the buffer layer 2. In short, the p-type region 6 is formed so as to extend to a deep region. As illustrated in FIG. 18, the p-type region 106 of the pin-type photodiode prior to the present invention is located within a shallow region and is formed in a region extending from the surface of the InP contact layer 105 to the type-II MQW absorption layer 103. The p-n junction 115 is located in the MQW absorption layer 103.

Figure 2:
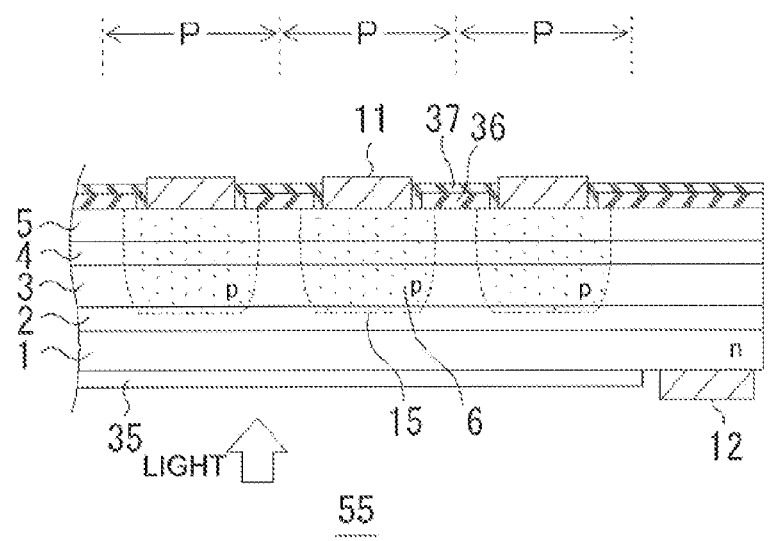
FIG. 2 is a cross-sectional view illustrating a light receiving element array in which light receiving elements each illustrated in FIG. 1 are arranged.

FIG. 2 is a view illustrating a light receiving element array 55 in which a plurality of light receiving elements each illustrated in FIG. 1 are arranged. Each of the light receiving elements or pixels P includes the above-described deep p-type region 6 reaching the buffer layer 2. This p-type region 6 is formed by selectively diffusing a p-type impurity, in particular, Zn. A region that is not subjected to the selective diffusion is interposed between the light receiving elements so that the light receiving elements are electrically or semi-conductively separated from each other. A selective diffusion mask pattern 36 composed of SiN and used for selective diffusion for forming the p-type region 6 is left as it is. A passivation film 37 composed of SiON or the like and covering the openings of the selective diffusion mask pattern 36 or the surface of the InP contact layer 5 and the selective diffusion mask pattern 36 is further provided.

In the light receiving element array 55, the p-type region 6 corresponds to a main portion of a corresponding pixel P, and each p-side electrode 11 functions as a pixel electrode. An n-side electrode (ground electrode) 12 for all the pixel electrodes 11 is held at a common ground potential.

Figure 3:
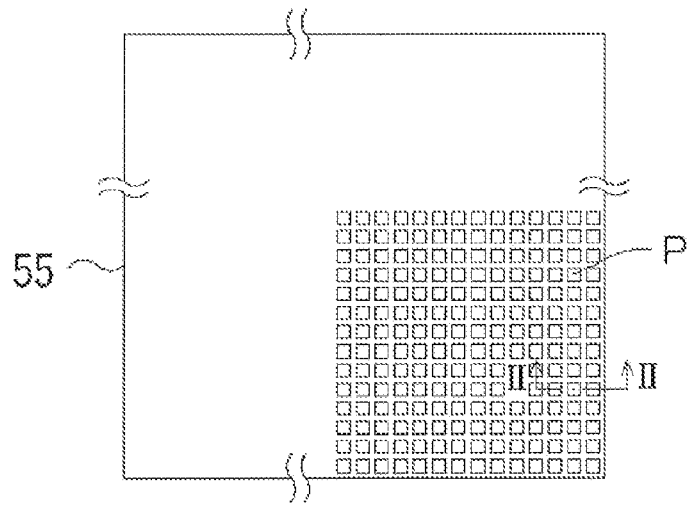
FIG. 3 is a plan view of the light receiving element array illustrated in FIG. 2.

FIG. 3 is a plan view of the light receiving element array 55 illustrated in FIG. 2. The pixel pitch is 30 μm, the number of pixels (light receiving elements) is 320×256, and the chip size is 10 mm in width×9 mm in length.

Figure 4:
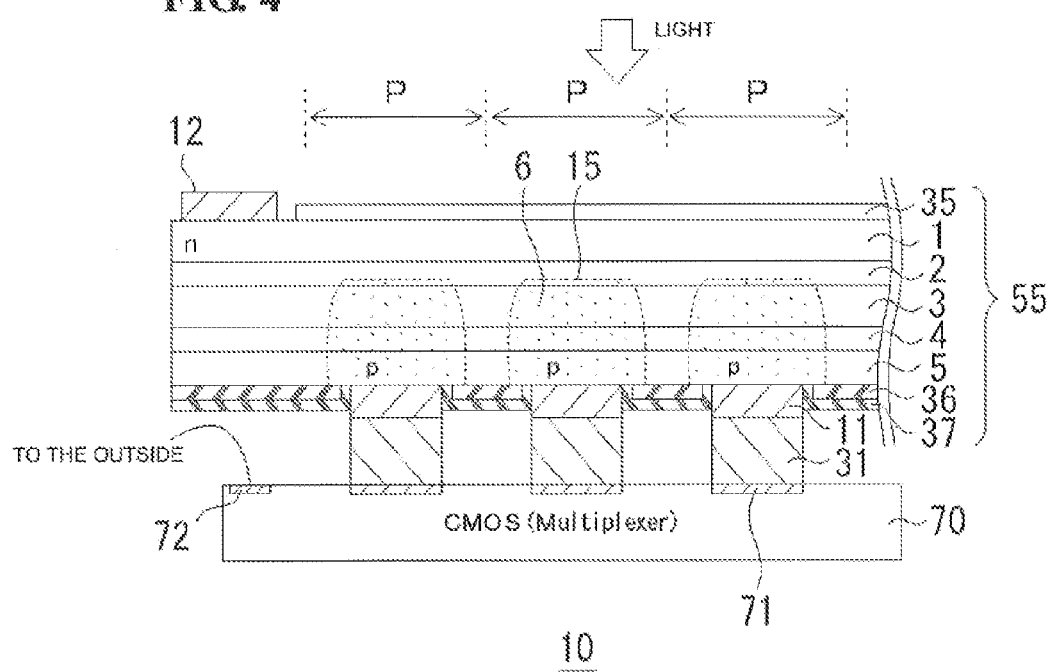
FIG. 4 is a cross-sectional view illustrating a hybrid-type detecting device formed by combining the light receiving element array illustrated in FIG. 2 and a CMOS.

FIG. 4 is a cross-sectional view illustrating a hybrid-type detecting device 10 formed by combining the light receiving element array 55 illustrated in FIG. 2 and a CMOS 70 which is a ROIC formed in silicon. A pixel electrode (p-side electrode) 11 of the light receiving element array 55 is conductively connected to a read-out electrode pad 71 of the CMOS 70 with a bonding bump 31 therebetween. An antireflection (AR) film 35 covers the rear surface of an InP substrate 1. Light is incident from the substrate side. The incident near-infrared light transmits through the InP substrate 1 and an InP buffer layer 2, and is received in an absorption layer 3 to which a depletion layer spreads, thus forming electron-hole pairs. An electron-hole pair generated in the depletion layer is separated by a reverse bias voltage. In an embodiment of the present invention, a hole is placed in an electric field having a gradient from a position near the InP substrate 1 in the absorption layer 3 to the p-side electrode 11. That is, as illustrated in part A of FIG. 19, a hole generated by light reception overcomes several hundred well barriers of the valence band in the MQW and reaches the pixel electrode.

Figure 5:
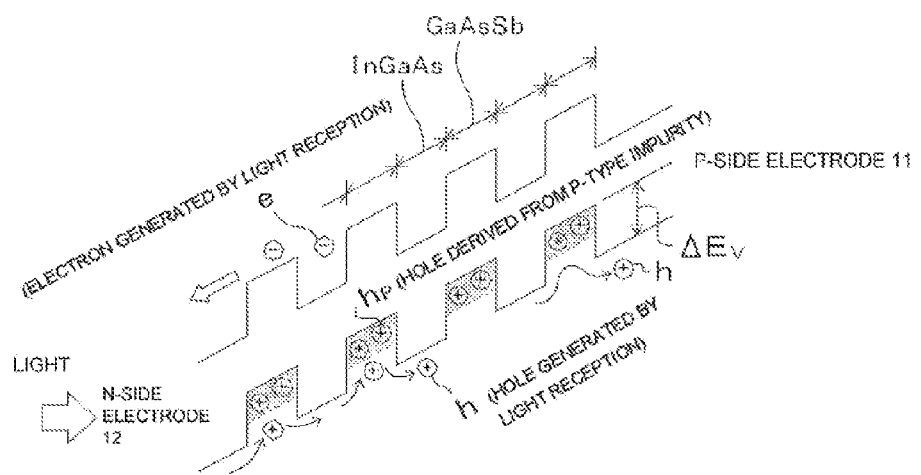
FIG. 5 includes band diagrams of an absorption layer constituted by a type-II GaAsSb/InGaAs MQW. Part A illustrates a band of an MQW that is converted into a p-type MQW by performing selective diffusion of a p-type impurity. Part B illustrates a band of an MQW constituted by an intrinsic semiconductor or an n$^-$-type semiconductor.
Figure 5:
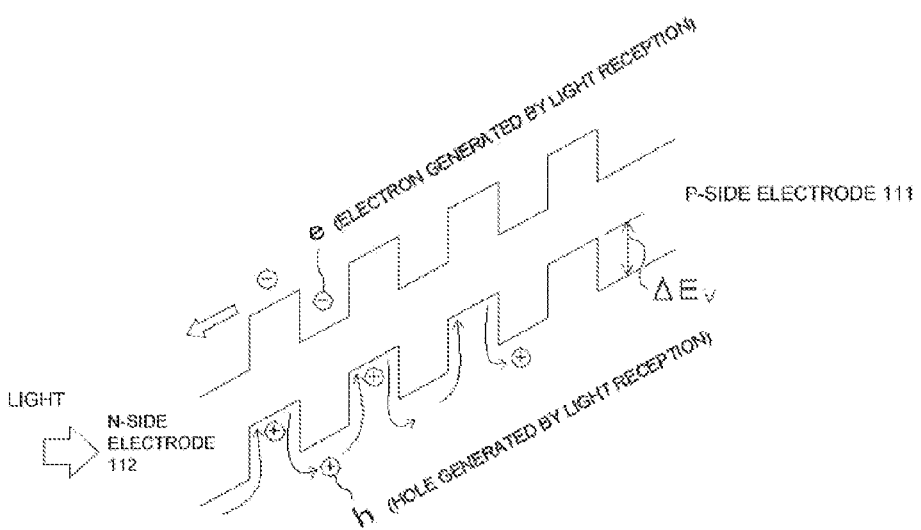

FIG. 5 includes band diagrams of an absorption layer 3 constituted by a type-II GaAsSb/InGaAs MQW. Part A of FIG. 5 illustrates a band for a photodiode (pixel) in which the p-type region 6 converts the MQW absorption layer into a p-type MQW absorption layer over the entire thickness of the absorption layer, as illustrated in FIG. 1 or FIG. 2. Part B of FIG. 5 illustrates a band of a photodiode prior to the present invention, the photodiode including an MQW absorption layer composed of an intrinsic semiconductor or an $n^-$-type semiconductor.

As illustrated in part B of FIG. 5, since the MQW absorption layer prior to the present invention is composed of an intrinsic semiconductor or an $n^-$-type semiconductor, holes are not present unless light is received, and thus hardly any of the respective levels of holes in the valence band are occupied. Therefore, the level of the ground state in the valence band is also vacant. In such a state, holes h are generated in the valence band of GaAsSb by light reception. (Electron behavior is not related to the present discussion, and thus is omitted). The holes h generated by light reception occupy levels of holes in the valence band in ascending order of level, while the holes h drift and overcome a large number of quantum wells under a reverse bias voltage. Since the level of the ground state is low in terms of energy and stable, the level of the ground state is preferentially occupied. As described above, the levels of holes h in the valence band of GaAsSb are located near the bottom of the quantum wells. As illustrated in part B of FIG. 5, a difference $\Delta Ev$ between the top of the valence band of GaAsSb and the top of the valence band of InGaAs acts as a barrier for a hole h in the ground state of GaAsSb. Since this barrier is high, it is not easy for a hole h, which is heavy, to exit from the well and to reach the pixel electrode 11. There are several hundred quantum wells. It is believed that many of the generated holes therefore disappear before the holes reach the pixel electrode 11. As a result, the light-reception sensitivity decreases.

As illustrated in part A of FIG. 5, in GaAsSb of the MQW that is converted into a p-type region by selective diffusion, at least the ground state is occupied by holes $h_p$ derived from a p-type impurity. That is, the holes $h_p$ derived from the p-type impurity have already occupied the ground state before light reception. These holes $h_p$ derived from the p-type impurity function as a step for a hole h generated by light reception. The hole h generated by light absorption occupies an energy level higher than the ground state in the valence band of GaAsSb. Accordingly, during drifting, it is sufficient that the hole h overcomes low barriers as compared with the hole h in the valence band of the MQW in part B of FIG. 5. In the MQW in part A of FIG. 5, since the holes $h_p$ derived from the p-type impurity raise the bottom of the valence band of GaAsSb, the hole h generated by light reception relatively easily overcomes the well barrier ΔEv, and the barrier ΔEv is not a large impediment to movement. Consequently, in the light receiving element array of this embodiment, under a reverse bias voltage, the hole h is driven by the electric field of the voltage and can relatively easily overcome several hundred wells and reach the pixel electrode (p-side electrode) 11. As a result, even in the case of substrate illumination, the light-reception sensitivity does not decrease, and a satisfactory sensitivity can be maintained. Specifically, even in the case of substrate illumination illustrated in part A of FIG. 19, it is possible to achieve a sensitivity equal to or close to the sensitivity in the case of contact layer illumination illustrated in part B of FIG. 19.

Next, a method for producing the light receiving element array 55 of this embodiment will be described. For example, a S-doped (100) InP substrate is used, and an epitaxial laminate (buffer layer 2/absorption layer 3 having type-II (InGaAs/GaAsSb) MQW/InGaAs diffusion concentration distribution control layer 4/InP contact layer 5) is formed on the InP substrate 1 by an organometallic vapor phase epitaxy (OMVPE) method or a molecular beam epitaxy (MBE) method. In this embodiment, a p-n junction 15 is arranged in the buffer layer 2 to form a pin photodiode. Therefore, the impurity concentration in the buffer layer 2 is suppressed. A ground electrode 12, which is an n-side electrode common to respective light receiving elements, is arranged so as to form an ohmic contact with the n-type InP substrate 1.

For example, a type-II MQW prepared by alternately growing 50 to 300 pairs of InGaAs (thickness: 5 nm)/GaAsSb (thickness: 5 nm) is used as the absorption layer 3. The compositions of InGaAs and GaAsSb are determined so as to lattice-match with the InP substrate 1. For example, the In content of InGaAs is preferably about 53.1 atomic percent, and the Sb content of GaAsSb is preferably about 48.7 atomic percent. The contact layer 5 composed of InP is then grown. The thickness of the contact layer 5 is preferably, for example, 0.8 μm. The diffusion concentration distribution control layer 4 composed of InGaAs may be interposed between the MQW absorption layer 3 and the InP contact layer 5 in order to control the selective diffusion concentration distribution of a p-type impurity, in particular, Zn, which will be described below. In FIGS. 1 and 3, the diffusion concentration distribution control layer 4 is used. In the case where the diffusion concentration distribution control layer 4 is interposed, the layer 4 is preferably composed of InGaAs. This is because even when a portion having a low impurity concentration and extending in the thickness direction (a portion on the absorption layer side, the portion having a certain thickness) is present, the electrical resistance does not tend to increase because of a relatively low band gap energy of InGaAs.

The light receiving element array 55 that is targeted by the present invention aims to have a light-reception sensitivity from the near-infrared region to the long-wavelength side thereof. Accordingly, the contact layer 5 is preferably composed of a material having a band gap energy larger than the band gap energy of the MQW absorption layer 3. For this reason, in general, InP, which has a band gap energy larger than that of the absorption layer and easily achieves lattice matching, is preferably used as the contact layer 5. Alternatively, InAlAs, which has a band gap energy substantially the same as that of InP, may be used as the contact layer 5.

Hereinafter, a description will be made of a case of the light receiving element array 55, but the basic production method need not be changed in producing a light receiving element. As described above, a p-type impurity is introduced into the inside of a peripheral portion of the light receiving element by diffusion so that the diffusion in the peripheral portion is two-dimensionally limited by performing selective diffusion using the selective diffusion mask pattern 36. It is necessary to form the p-type region 6 so as to extend to a deep position, as compared with the case of the light receiving element array prior to the present invention. For this purpose, preferably, metallic zinc and red phosphorus are used as materials, and the selective diffusion temperature is in the range of 500° C. to 650° C. After conducting the selective diffusion, a passivation film 37 is arranged so as to cover the selective diffusion mask pattern 36 and the contact layer 5. The details will be described in Examples.

The passivation film 37 composed of SiON or the like, a pixel electrode 11 which is a p-side electrode, and a ground electrode 12 which is an n-side electrode are formed at predetermined positions by an evaporation method, photolithography, and etching. The pixel electrode 11 composed of AuZn and the ground electrode 12 composed of AuGeNi are formed so as to respectively form an ohmic contact with a corresponding semiconductor region. An AR film 35 composed of SiON is formed over the entire rear surface of the InP substrate 1.

(Modification of Embodiment 1)

Figure 7:
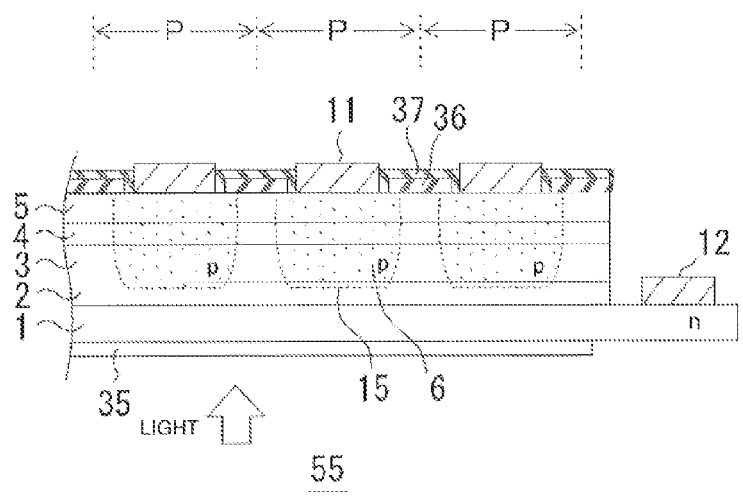
FIG. 7 illustrates a modification of the light receiving element array illustrated in FIG. 2, and illustrates an embodiment of the present invention.

FIG. 7 illustrates a modification of the light receiving element array 55 illustrated in FIG. 2, and this modification is an embodiment of the present invention. In this light receiving element array 55, an n-side electrode 12 functioning as a ground electrode common to each pixel is provided on a front surface side (epitaxial layer side) of the n-type InP substrate 1. Even in the case where the n-side electrode 12 is provided at this position, a depletion layer can be spread from a p-n junction 15 by applying a voltage between the n-side electrode 12 and a p-side electrode 11 of each pixel.

Figure 8:
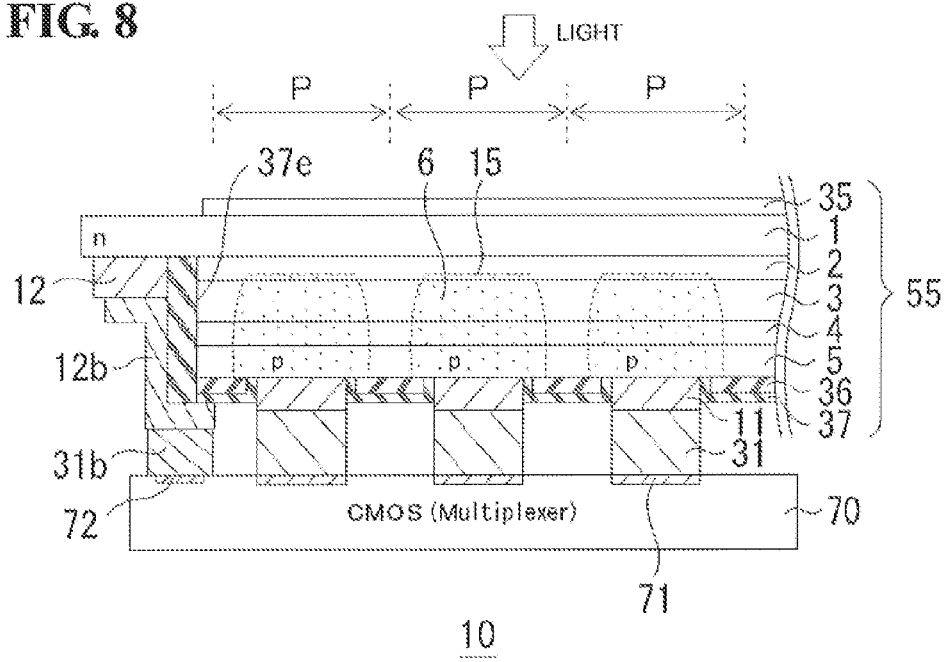
FIG. 8 illustrates a modification of the hybrid-type detecting device illustrated in FIG. 4, and illustrates an embodiment of the present invention.

FIG. 8 is a view illustrating a hybrid-type detecting device 10 including the light receiving element array 55 illustrated in FIG. 7, and this device is a modification of the hybrid-type detecting device 10 illustrated in FIG. 4. Of course, the hybrid-type detecting device 10 illustrated in FIG. 8 is also an embodiment of the present invention. A connection electrode 12b is provided on a passivation film 37e covering a side face of epitaxial layers so as to extend from an n-side electrode 12 located so as to face a CMOS 70 to the CMOS side. A bonding bump 31b is interposed between the connection electrode 12b and a ground electrode 72 of the CMOS 70 so as to conductively connect the connection electrode 12b to the ground electrode 72. With the arrangement of the n-side electrode 12 illustrated in FIG. 7, a compact wiring structure illustrated in FIG. 8 can be realized in fabricating the hybrid-type detecting device 10.

EXAMPLES

A method for forming the p-type region 6 in Embodiment 1 of the present invention in a range reaching the buffer layer 2 was verified by way of Examples. Two specimens, namely, an example of the present invention and a comparative example (light receiving element array prior to the present invention) were prepared.

Example of the Present Invention

Figure 6:
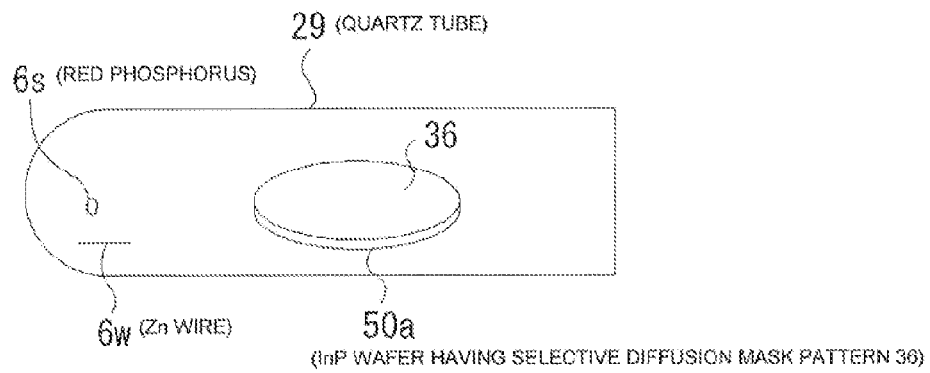
FIG. 6 is a view illustrating a method for selectively diffusing a p-type impurity in Embodiment 1 of the present invention.

As illustrated in FIG. 6, a semiconductor wafer 50a on which a selective diffusion mask pattern 36 was formed, red phosphorus 6s, and a zinc wire 6w were vacuum-sealed in a quartz tube 29. In the vacuum sealing, the quartz tube 29 was evacuated to a pressure of about $1 \times 10^{-6}$ ton. The vacuum-sealed quartz tube 29 was heated at 600° C. for 30 minutes.

Comparative Example

In a light receiving element prior to the present invention, an InP wafer on which a selective diffusion mask pattern was formed and $Zn_3P_2$ were sealed in a quartz tube, and the quartz tube was evacuated to a pressure of about $1 \times 10^{-6}$ torr. Selective diffusion was then conducted by heating the quartz tube at 480° C. for 50 minutes so that Zn reached an absorption layer.

Figure 9:
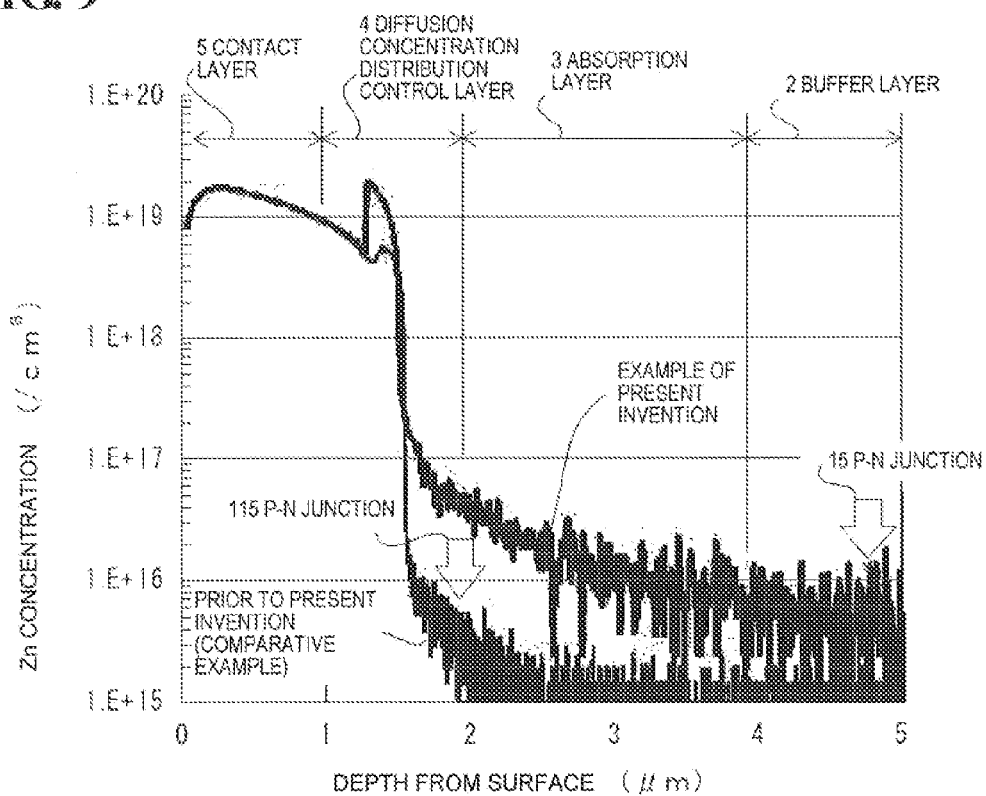
FIG. 9 is a graph showing a concentration distribution of selectively diffused Zn in the depth direction in examples of the present invention (an example of the present invention and a comparative example).

FIG. 9 shows a concentration distribution of Zn, which was selectively diffused by the above methods, in the depth direction in the example of the present invention and the comparative example. In the example of the present invention, a p-n junction 15 is located in a buffer layer 2. The Zn concentration in the type-II MQW absorption layer 3 maintains 5e15 $cm^{-3}$ or more and is suppressed to 1e17 $cm^{-3}$ or less while Zn is diffused to a deep position. That is, the Zn concentration in the absorption layer 3 is in the range of 5e15 $cm^{-3}$ or more and 1e17 $cm^{-3}$ or less. In the comparative example, the concentration distribution of Zn is located in a shallow region, and a p-n junction is located at an upper end of the absorption layer.

The difference in the method of selective diffusion between the example of the present invention and the comparative example is as follows.

The heating pattern of the selective diffusion is 600° C.×30 minutes in the example of the present invention, whereas the heating pattern is 480° C.×50 minutes in the comparative example.

The material of the p-type impurity of the selective diffusion is a zinc wire (wire material) and red phosphorus in the example of the present invention, whereas the material of the p-type impurity is $Zn_3P_2$ in the comparative example. The zinc wire in the example of the present invention may be a zinc slab or the like.

Referring to FIG. 9, the p-n junction 15 in the example of the present invention should be broadly interpreted as follows. In the absorption layer 3, when a region (buffer layer 2) on a side opposite a surface from which the p-type impurity element Zn is introduced by selective diffusion is an impurity region (referred to as "i region") in which the impurity concentration is low enough for the impurity region to be considered as an intrinsic semiconductor, a junction formed between this i-region and the p-type region 6 formed by the selective diffusion is also included in the p-n junction. That is, the p-n junction described above may be a pi-junction or the like. Furthermore, the p-n junction also includes a case where the p concentration in the pi junction is very low.

As described above, the p-type region 6 is formed, using a SiN selective diffusion mask pattern 36 formed on the surface of the InP contact layer 5, by selectively diffusing Zn from an opening of the selective diffusion mask pattern 36 so that the p-type region. 6 reaches the buffer layer 2 through the InGaAs/GaAsSb (or InGaAsN/GaAsSb) MQW absorption layer 3. A front leading end of the p-type region 6 forms the p-n junction 15 in the buffer layer 2. The Zn concentration distribution near the p-n junction 15 is a distribution showing a graded junction.

According to the above production method, adjacent light receiving elements are separated from each other by performing selective diffusion of Zn (diffusion that is two-dimensionally limited so that a diffused portion is disposed inside a peripheral portion of each light receiving element) without performing mesa etching for element separation as in a known method, while the p-type impurity is caused to reach a deep position in the depth direction. Specifically, the p-type region 6 forms a main portion of one pixel portion P and regions where Zn does not diffuse separate respective pixels from each other. Therefore, the light receiving element array does not suffer from, for example, crystal damage caused by mesa etching, and thus a dark current can be suppressed.

In the case where the p-n junction 15 is formed by selective diffusion of an impurity, the impurity diffuses not only in the depth direction but also in the lateral direction (the direction orthogonal to the depth direction). Thus, there is a concern that the distance between elements cannot be decreased to a certain dimension or less. However, according to an experimental result of selective diffusion of Zn, it was confirmed that, in the structure in which the InP contact layer 5 is disposed on the top surface and the InGaAs diffusion concentration distribution control layer 4 is disposed under the InP contact layer 5, the area of the diffusion in the lateral direction is substantially the same as or smaller than the area of the diffusion in the depth direction. That is, in selective diffusion of Zn, although Zn diffuses in the lateral direction so that the diameter of a diffusion region is larger than the diameter of an opening of the selective diffusion mask pattern 36, the degree of diffusion is small and the region is only slightly expanded from the opening of the selective diffusion mask pattern 36, as schematically shown in, for example, FIG. 2. The selective diffusion mask pattern 36 and the InP contact layer 5 are covered with the passivation film 37 composed of SiON or the like.

(Embodiment 2-Optical Sensor Device (1)-)

Figure 10:
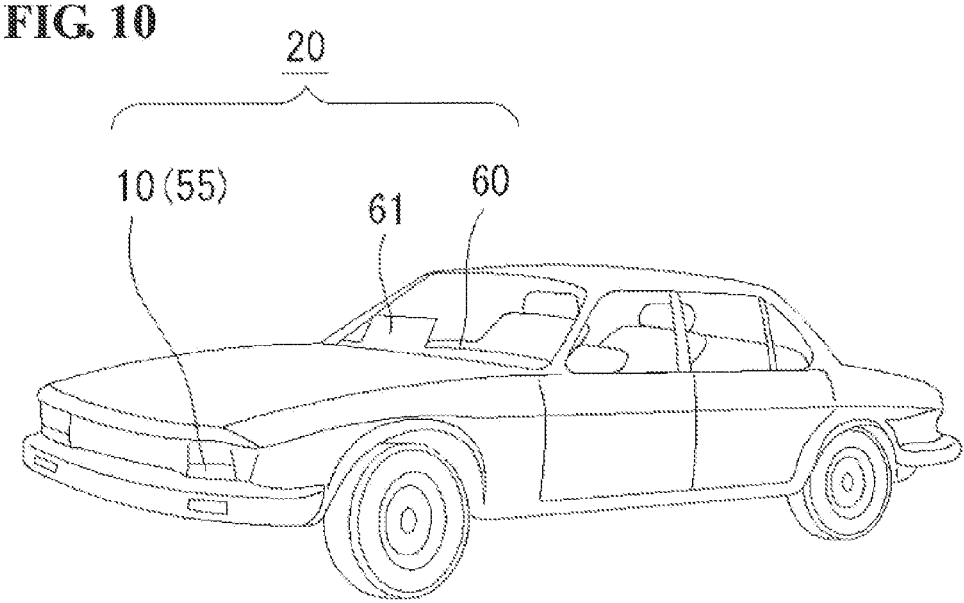
FIG. 10 is a view illustrating an imaging device or a visibility support device, which is an optical sensor device according to Embodiment 2 of the present invention.
Figure 11:
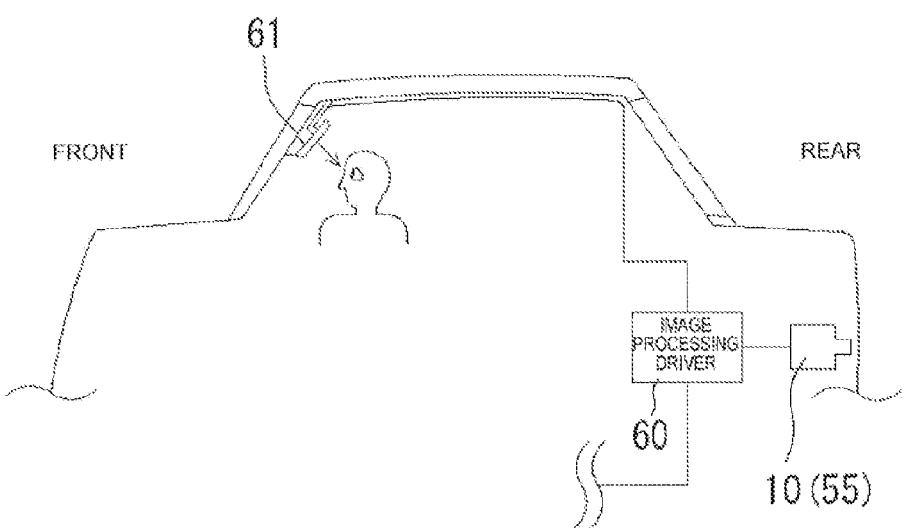
FIG. 11 is a view illustrating a visibility support device for the nighttime rear of an automobile.

FIG. 10 is a view illustrating an imaging device or a visibility support device, which is an optical sensor device 20 according to Embodiment 2 of the present invention. The visibility support device is installed in a vehicle in order to support the forward visibility for a driver when driving an automobile at night. A hybrid-type detecting device 10 including the light receiving element array 55 described in Embodiment 1, a CMOS, an optical element such as a lens (not illustrated), etc., a display monitor 61 that displays a captured image, and a control device 60 that controls the driving of the hybrid-type detecting device 10 and the display monitor 61 are installed in the vehicle. FIG. 11 is a view illustrating a visibility support device for supporting the nighttime rear visibility, the visibility support device being installed in a vehicle in order to support the rear visibility for a driver when driving an automobile at night. An image captured by a hybrid-type detecting device 10 including the light receiving element array 55 described in Embodiment 1, a CMOS, an optical element such as a lens, etc. and installed in the rear of the automobile in the backward direction is displayed on a display device 61 disposed in front of and above the driver's head. Driving of the hybrid-type detecting device 10 (or the light receiving element array 55) and the display device 61 are controlled by a control device 60.

In a visibility support device for a vehicle prior to the present invention, an image is formed by receiving light in the near-infrared region reflected or emitted from an object, and thus the following problem occurs. In the case where reflected light is used, a light source is necessary, an installation space of the light source is necessary, and the cost is increased. In the case where radiant heat of an object is used, it is difficult to recognize a non-heat generating object other than a person, and a pedestrian who wears winter clothes etc., and thus it is necessary to use recognition means other than an infrared camera in combination. In addition, in the case where a light source is used, it is necessary to take measures against negative effects on the human body, namely, measures to ensure eye safety in some wavelength ranges to be used.

In the visibility support device in this embodiment, such an extra light source or measures to ensure eye safety are unnecessary. The object whose image is to be captured may generate heat or may not generate heat. Furthermore, a clear image of an object can be obtained even in an environment containing moisture, for example, in fog. Accordingly, it is possible to provide a satisfactory visibility support device for a vehicle at night. This is due to the use of a light receiving element which utilizes reflected light of cosmic light in the short wavelength infra-red (SWIR) band from an object, in which a dark current is sufficiently small, and which has a good dynamic range (SN). Visibility support devices for an automobile have been described above. However, the light receiving element can also be used in other devices such as a night vision device, a navigation support apparatus, an intruder monitoring device, a room monitoring device, and an urban fire monitoring device arranged at a high position.

(Embodiment 3-Optical Sensor Device (2)-)

Figure 12:
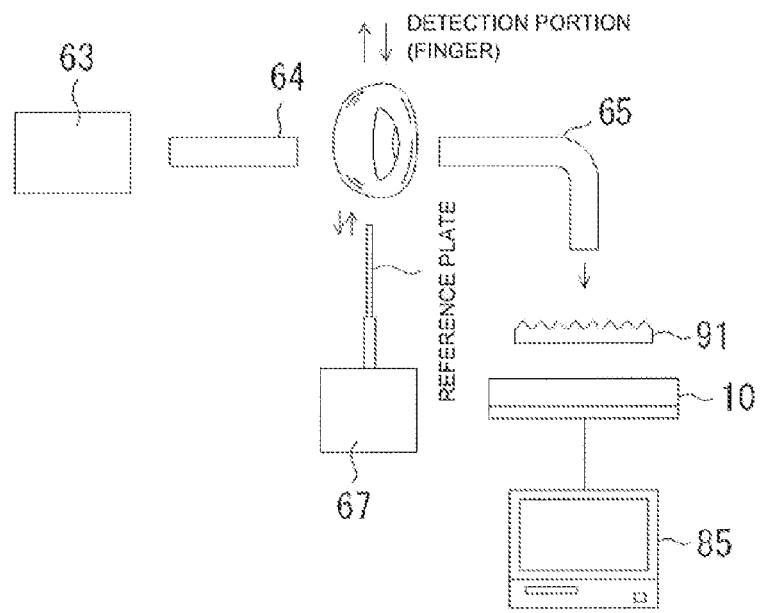
FIG. 12 is a view illustrating a biological component detection device, which is an optical sensor device according to Embodiment 3 of the present invention.

FIG. 12 is a view illustrating a biological component detection device, which is an optical sensor device 20 according to Embodiment 3 of the present invention. In FIG. 12, the above-described hybrid-type detecting device 10 is used in a light-receiving unit and a concentration measurement is performed by using an absorption band of glucose, the absorption band being located in a long-wavelength region of the near-infrared region. In this embodiment, the glucose concentration is determined by measuring near-infrared light that is transmitted through a biological object. Alternatively, a reflected light of a human body may be used. The light passes through the following path:

light source 63→irradiation optical fiber 64→detection portion (finger)→information-carrying optical fiber 65→diffraction grating (spectrometer) 91→hybrid-type detecting device 10→control unit 85

In the above path, the spectrometer 91 may be arranged between the light source 63 and the irradiation fiber 64. According to the above structure, by obtaining an absorption spectrum of a blood component in the detection portion, the absolute value, the relative value, or the magnitude of the blood glucose level can be determined in the control unit 85. In the example illustrated in FIG. 12, light transmitted through a human finger is received, and information on various types of biological tissue such as the skin, the muscle, and the blood can be obtained.

A reference signal is measured on the basis of light transmitted through a reference plate that is driven by an actuator 67 so that the reference plate is retracted when a biological object (finger) is placed in position and the reference plate is placed in position when the biological object is retracted. The thickness of the reference plate is preferably small so that a sufficient amount of transmitted light is obtained, though the thickness depends on the material of the reference plate. The reference plate is moved by the actuator 67 so that variations in position and orientation (angle) are not generated.

The above optical sensor device is an example in which the hybrid-type detecting device 10 is installed in the optical sensor device 20 and used for the measurement of the blood glucose level using light transmitted through the human body. Alternatively, the optical sensor device can be applied to the measurement of the blood glucose level, body fat, collagen in the cornea of the eye, a distribution image of facial collagen, and the like using light reflected from the human body.

(Embodiment 4-Optical Sensor Device (3)-)

Figure 13:
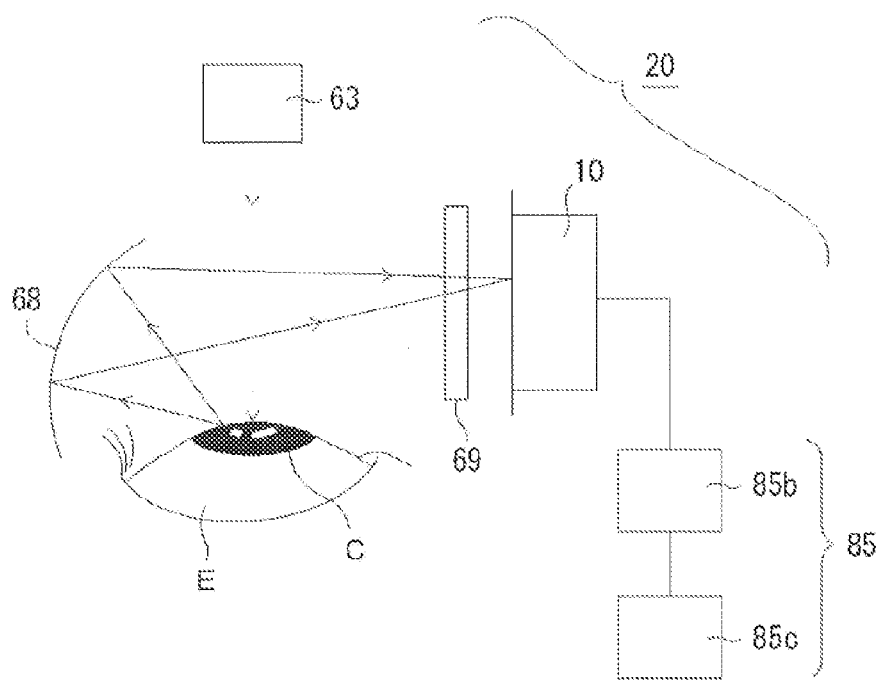
FIG. 13 is a view illustrating a detector of moisture in a biological object (device for forming a moisture distribution image of the eye) which is an optical sensor device, according to Embodiment 4 of the present invention.

FIG. 13 is a view illustrating a detector of moisture in a biological object (device for forming a moisture distribution image of the eye), which is an optical sensor device according to Embodiment 4 of the present invention. Many problems of the eye include symptoms related to moisture, such as dry eye and watery eye. When such a symptom occurs, the symptom can be evaluated by taking a moisture distribution image not only on the cornea C but also over the entire front surface of the eye E, as illustrated in FIG. 13. For example, it is possible to determine that the moisture concentration is unusually high at a position corresponding to the lacrimal gland. A concave mirror having a high reflectivity for near-infrared light is preferably used as a concave mirror 68. For example, a concave mirror composed of gold (Au) is used. The concave mirror 68 is disposed not in front of the eye but beside the eye so that light emitted from a light source 63 and reflected from respective portions of the eye is reflected to form an image of the respective portions of the eye on an imaging device, i.e., a hybrid-type detecting device 10. A filter 69 preferably transmits light of about 1.4 μm or light of about 1.9 μm that belongs to an absorption band of water. A microcomputer 85b of a control unit 85 forms a moisture distribution image in the eye E on the basis of output signals of pixels of the hybrid-type detecting device 10 and displays the image on a display unit 85c. According to the imaging device 10 of the present invention, since the dark current is low and a high sensitivity is obtained to the long-wavelength side, a clear moisture distribution image having a high S/N ratio can be obtained. Therefore, this moisture distribution image is useful for understanding the function of water and the movement of water in the eye, for example.

Since the eye very sensitively responses to light, it is preferable that the light source 63 be not used. An emission peak of an SWIR cosmic light spectrum can be used as a light source. For example, the wavelength of a certain emission peak of SWIR lies at about 1.4 μm, which belongs to an absorption band of water. Accordingly, the light source 63 is removed and the SWIR cosmic light can be alternatively used. Alternatively, if the artificial light source 63 is used, the light may be limited to the near-infrared region and the peak value of the light may be, for example, double the peak intensity of the SWIR cosmic light. By using the SWIR cosmic light as a light source, eye safety can be reliably realized. The reason why the SWIR cosmic light can be used or a light source having a low intensity level can be used as described above is that the dark current of the hybrid-type detecting device 10 constituting an imaging device according to this embodiment can be reduced. That is, the reason is that a clear image can be formed even by a weak signal.

The above optical sensor device is an example of a detector of moisture in the eye, which is a part of a biological object. Alternatively, the optical sensor device can be applied to, for example, the measurement of moisture in natural products (such as the measurement of moisture in a melon (quality certification), the measurement of the mixing ratio of unhusked rice utilizing the moisture content, and the measurement of moisture in other fruits, dried layer seaweed, fishes and shellfishes, dairy products, or the like), the measurement of moisture in the cornea in a corneal corrective surgery, the measurement of moisture in a biological object such as the facial skin, the measurement of moisture in paper products, the measurement of moisture in oil in an automatic oil draining device, the measurement of moisture in a dehydrated cake of polluted sludge, the measurement of moisture in coal, and the measurement of moisture in clothes in a cloth drier.

(Embodiment 5-Optical Sensor Device (4)-)

Figure 14:
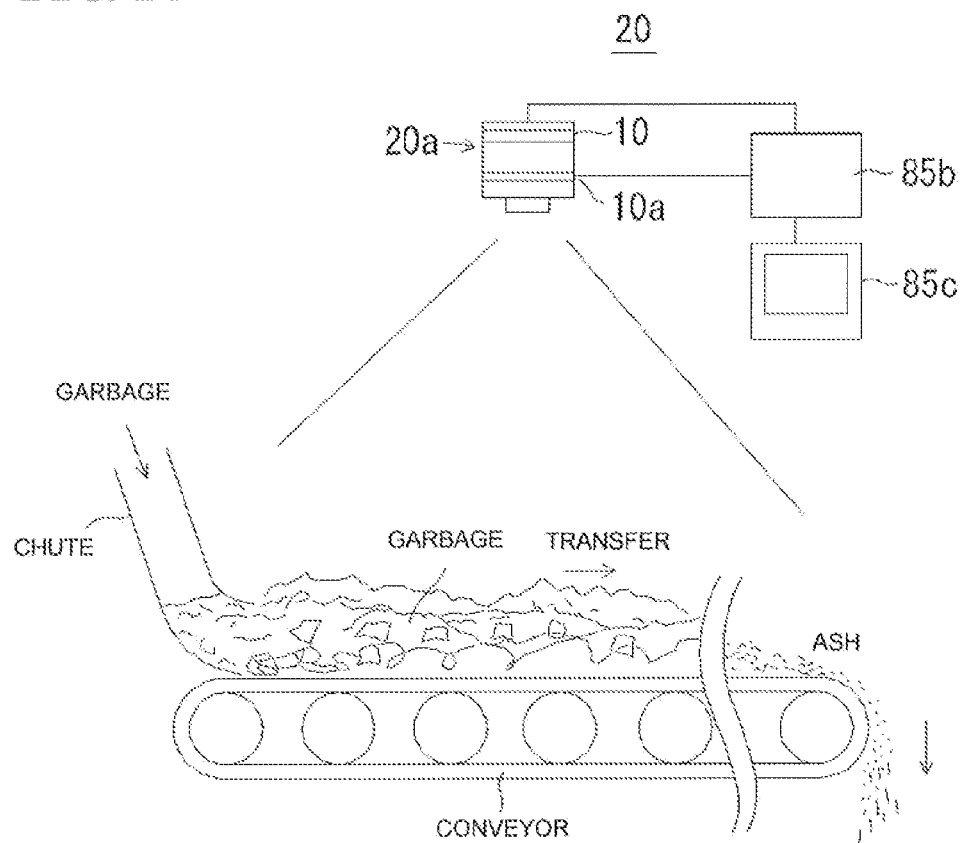
FIG. 14 is a view illustrating a temperature distribution measuring device for obtaining a temperature distribution of garbage in a combustor, the temperature distribution measuring device being an optical sensor device according to Embodiment 5 of the present invention.
Figure 15:
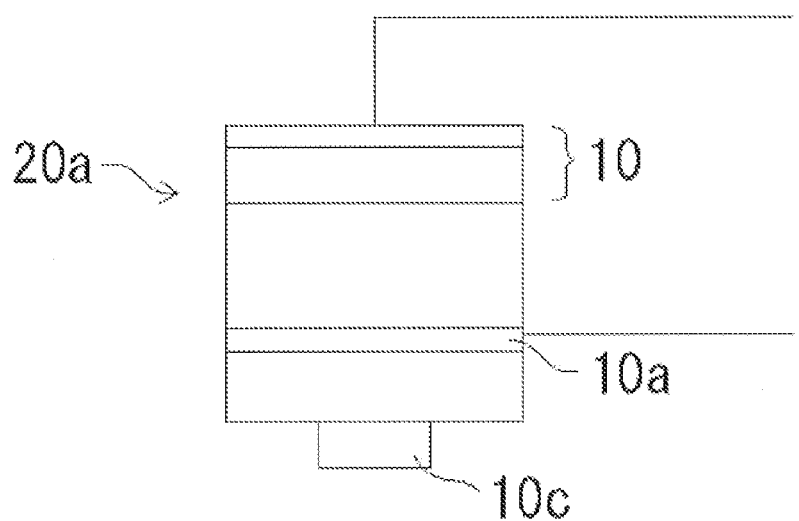
FIG. 15 is a view illustrating a temperature distribution imaging device in FIG. 14.
Figure 16:
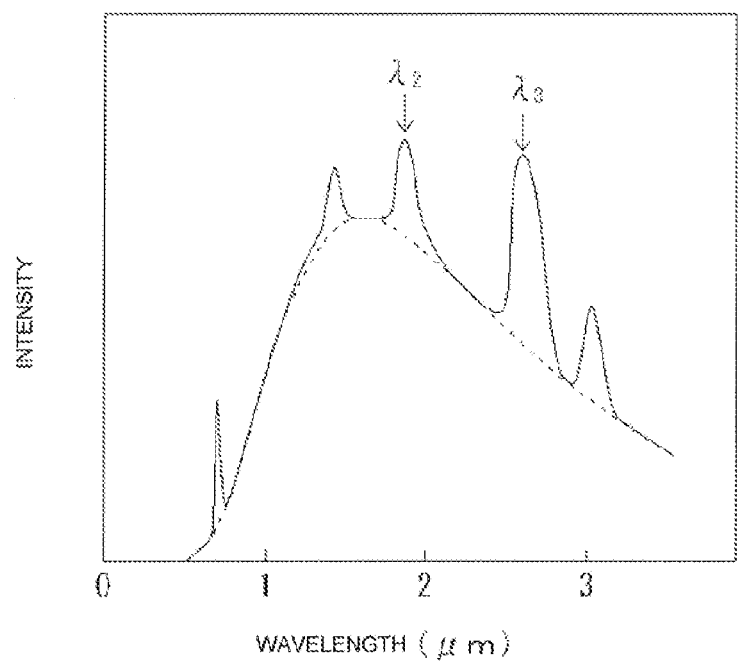
FIG. 16 is a graph showing a near-infrared spectrum in a combustor.
Figure 17:
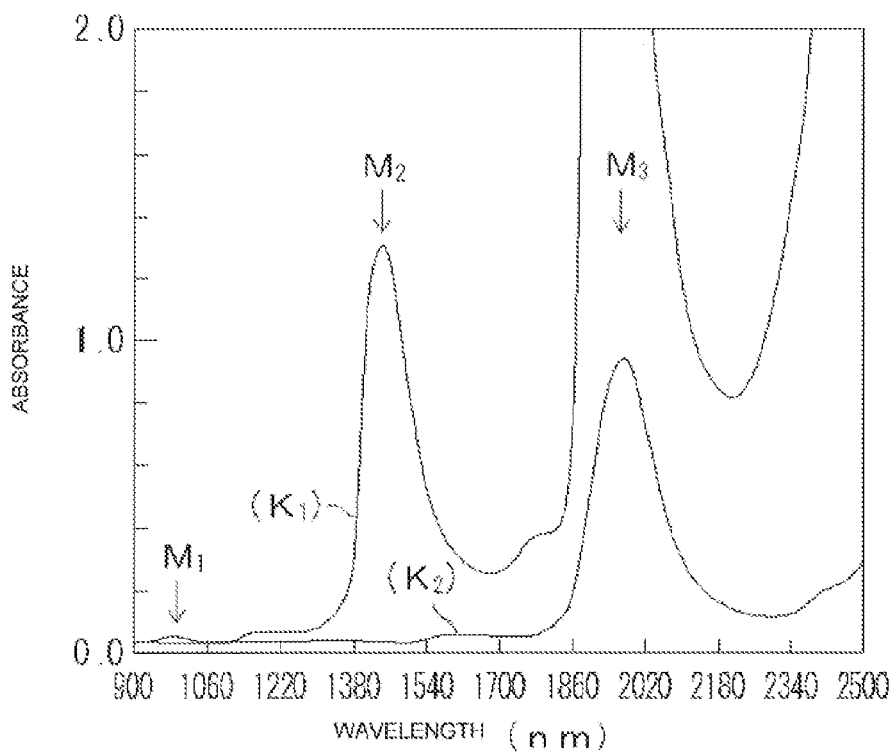
FIG. 17 is a graph showing an absorption spectrum of water.

FIG. 14 illustrates a temperature distribution measuring device for obtaining a temperature distribution of garbage in a combustor, the temperature distribution measuring device being an optical sensor device 20 according to Embodiment 5 of the present invention. The temperature distribution measuring device is a specific example of an environment monitoring device for determining the concentration of a component in gas. FIG. 15 is a view illustrating a temperature distribution imaging device 20a. In the combustor, carbon or hydrocarbons are present in the form of a block, and thus are not present in the form suitable for a fuel. Accordingly, the amount of soot is small, and a large amount of moisture is present. FIG. 16 shows a near-infrared spectrum in a combustor, and emission spectrum wavelengths $\lambda_2$ and $\lambda_3$ of water are noticeably observed. In this embodiment, the concentration and the temperature of water are monitored by utilizing a phenomenon that an emission spectrum of water changes depending on the temperature, in combination with an absorption spectrum of water shown in FIG. 17. In FIGS. 17, (K1) and (K2) were measured using cuvette cells with a size of 10 mm and 1 mm, respectively. Since the intensity of the emission spectrum is also proportional to the concentration of water, it is difficult to perform measurement with high accuracy using only the two emission peak wavelengths. Therefore, the absorption spectrum is also used in combination.

In the temperature distribution imaging device 20a, an interference filter 10a is important. The interference filter 10a is a filter having transmission wavelengths at the above-mentioned emission peak wavelengths $\lambda_2$ and $\lambda_3$ of water, and a plurality of absorption peak wavelengths. For example, regarding the absorption peak wavelengths, as shown in FIG. 17, the absorption spectrum has two sharp peaks M2 and M3 in the near-infrared region. The interference filter 10a is configured to pass light components having these wavelengths. Accordingly, the interference filter 10a includes total four types of filters or filters having total four transmission wavelengths including the above two emission peak wavelengths. It is preferable to provide an automatic selection mechanism that automatically selects these four types of interference filters by an external operation. An optical system 10c such as a lens also preferably includes an automatic focusing mechanism that automatically adjusts the focus. For example, an image of garbage or a slightly upper portion of the garbage is captured with respect to light components having four wavelengths in accordance with the above four types of interference filters. Thus, an image corresponding to the four wavelengths can be obtained.

The intensities of the light components at the above wavelengths may be determined in advance with respect to air having various water vapor temperatures and various water vapor concentrations, thereby determining a regression equation of the temperature. This temperature regression equation is stored in a microcomputer 85b of a control unit. By the above imaging, the intensities of respective wavelengths can be obtained at each position. By using the temperature regression equation, the temperature can be determined at each position. The combustion state of garbage can be determined with high accuracy by monitoring both the temperature and the concentration of water as described above.

Hitherto, a large number of temperature sensors have been arranged in a combustor. However, the number of temperature sensors can be reduced by arranging the device of this embodiment on an upper portion or the top of a combustor.

Embodiments and Example of the present invention have been described above. The embodiments and Example of the present invention disclosed above are only illustrative, and the scope of the present invention is not limited to these embodiments of the invention. It is to be understood that the scope of the present invention is defined by the description of Claims and includes equivalence of the description in Claims and all modifications within the scope of Claims.

INDUSTRIAL APPLICABILITY

According to the light receiving element array, etc. of the present invention, a satisfactory sensitivity can be obtained in the near-infrared region in both cases of substrate illumination and contact layer illumination while electrons of electron-hole pairs generated in an absorption layer having a type-II MQW are collected in an n-side electrode, and holes, which have a small mobility, are efficiently moved to a pixel electrode by converting the MQW into a p-type MQW. Accordingly, high-quality products can be obtained in the fields of industry, medical science, daily commodities, etc.

The invention claimed is:

1. A light receiving element array in which a plurality of light receiving elements are arranged, the light receiving element array comprising:
   a substrate composed of a compound semiconductor, the substrate having a rear surface that is configured to receive light incident thereon;
   an n-type buffer layer disposed on the substrate;
   an absorption layer disposed on the n-type buffer layer, the absorption layer having a type-II multi-quantum well structure;
   a contact layer disposed on the absorption layer; and
   a p-type region that is provided for each of the light receiving elements, the p-type region extending from a surface of the contact layer to into the n-type buffer layer through the absorption layer so as to form a p-n junction,
   wherein the p-type region is formed by selectively diffusing a p-type impurity in a depth direction,
   the p-type region of a light receiving element is separated from the p-type region of an adjacent light receiving element by a region that is not subjected to selective diffusion, and
   the p-n junction is formed in the n-type buffer layer on a crossed face of a p-type carrier concentration of the p-type region and an n-type carrier concentration of the n-type buffer layer.

2. The light receiving element array according to claim 1, wherein the absorption layer and the contact layer are n-type except for the p-type region, and the p-type region is surrounded by an n-type region.

3. The light receiving element array according to claim 1, wherein the p-type carrier concentration of the p-type region in the absorption layer having the multi-quantum well structure is 5e15 $cm^{-3}$ or more and 1e17 $cm^{-3}$ or less.

4. The light receiving element array according to claim 1, wherein the n-type carrier concentration of the n-type buffer layer is 1e15 $cm^{-3}$ or more and 5e15 $cm^{-3}$ or less.

5. The light receiving element array according to claim 1, wherein the n-type buffer layer has a thickness of 1 μm or more and 6 μm or less.

6. The light receiving element array according to claim 1, wherein the substrate composed of a compound semiconductor is an InP substrate, and the type-II multi-quantum well structure constituting the absorption layer is a repetition of any one of (GaAsSb/InGaAs), (GaAsSb/InGaAsN), (GaAsSb/InGaAsNSb), and (GaAsSb/InGaAsNP).

7. The light receiving element array according to claim 1, further comprising a selective diffusion mask pattern disposed so as to cover the contact layer and having an opening on the p-type region.

8. A hybrid-type detecting device comprising the light receiving element array according to claim 1; and a read-out circuit formed in silicon, wherein a read-out electrode of the read-out circuit is conductively connected to a corresponding p-side electrode of the light receiving element array.

9. The hybrid-type detecting device according to claim 8, wherein light is incident from a rear surface of the substrate of the light receiving element array.

10. An optical sensor device comprising the light receiving element array according to claim 1.

11. The light receiving element array according to claim 1, wherein the n-type buffer layer is composed of an intrinsic semiconductor, and
the n-type buffer layer has the n-type carrier concentration lower than the p-type carrier concentration of the p-type region in the absorption layer.

12. A light receiving element comprising:
a substrate composed of a compound semiconductor, the substrate having a rear surface that is configured to receive light incident thereon;
an n-type buffer layer disposed on the substrate;
an absorption layer disposed on the n-type buffer layer, the absorption layer having a type-II multi-quantum well structure;
a contact layer disposed on the absorption layer; and
a p-type region extending from a surface of the contact layer into the n-type buffer layer through the absorption layer so as to form a p-n junction,
wherein the p-type region is formed by selectively diffusing a p-type impurity from the surface of the contact layer in a depth direction, the p-type region is separated from the periphery by a region that is not subjected to selective diffusion, and
the p-n junction is formed in the n-type buffer layer on a crossed face of a p-type carrier concentration of the p-type region and an n-type carrier concentration of the n-type buffer layer.

* * * * *